United States Patent
Horiuchi et al.

(10) Patent No.: US 8,564,953 B2
(45) Date of Patent: Oct. 22, 2013

(54) SEMICONDUCTOR POWER MODULE, INVERTER/CONVERTER INCLUDING THE SAME, AND METHOD OF MANUFACTURING A COOLING JACKET FOR SEMICONDUCTOR POWER MODULE

(75) Inventors: Keisuke Horiuchi, Hitachinaka (JP); Michiaki Hiyoshi, Yokohama (JP); Koji Sasaki, Mito (JP)

(73) Assignee: Hitachi, Ltd., Tokyo (JP)

( * ) Notice: Subject to any disclaimer, the term of this patent is extended or adjusted under 35 U.S.C. 154(b) by 343 days.

(21) Appl. No.: 13/013,987

(22) Filed: Jan. 26, 2011

(65) Prior Publication Data

US 2011/0188204 A1   Aug. 4, 2011

(30) Foreign Application Priority Data

Jan. 29, 2010 (JP) .................. 2010-017592
Nov. 12, 2010 (JP) .................. 2010-253373

(51) Int. Cl.
*H05K 7/20* (2006.01)

(52) U.S. Cl.
USPC ........... 361/703; 361/677; 361/689; 361/710; 361/715; 257/707; 257/714

(58) Field of Classification Search
None
See application file for complete search history.

(56) References Cited

U.S. PATENT DOCUMENTS

| | | | |
|---|---|---|---|
| 5,349,498 A | 9/1994 | Tanzer et al. | |
| 6,166,937 A | 12/2000 | Yamamura et al. | |
| 7,551,439 B2 * | 6/2009 | Peugh et al. | 361/699 |
| 7,589,418 B2 | 9/2009 | Lederer et al. | |
| 7,656,672 B2 | 2/2010 | Schilling et al. | |
| 7,965,508 B2 * | 6/2011 | Yamamoto et al. | 361/699 |
| 8,159,823 B2 * | 4/2012 | Murakami | 361/716 |
| 8,213,179 B2 * | 7/2012 | Yoshida et al. | 361/699 |
| 8,355,244 B2 * | 1/2013 | Kimura et al. | 361/676 |
| 2001/0014029 A1 | 8/2001 | Suzuki et al. | |
| 2004/0066643 A1 * | 4/2004 | Beihoff et al. | 361/816 |
| 2007/0194429 A1 | 8/2007 | Lederer et al. | |
| 2007/0253164 A1 | 11/2007 | Matsuo et al. | |
| 2008/0198548 A1 | 8/2008 | Nakamura et al. | |
| 2009/0040724 A1 | 2/2009 | Nishikimi et al. | |
| 2009/0231811 A1 | 9/2009 | Tokuyama et al. | |
| 2009/0241575 A1 | 10/2009 | Jadric et al. | |

FOREIGN PATENT DOCUMENTS

| | | |
|---|---|---|
| CA | 2 575 817 A1 | 10/2006 |
| CN | 1993875 A | 7/2007 |
| CN | 101064299 A | 10/2007 |
| DE | 43 27 895 A1 | 2/1995 |
| DE | 693 29 103 T2 | 3/2001 |
| DE | 10 2006 006 425 A1 | 8/2007 |

(Continued)

OTHER PUBLICATIONS

"Anti corrosion guide for copper pipes used in building pipe lines", Jpn. Copp. Develop. Asoc., 1987, p. 16 (Six (6) pages) Japanese language.

(Continued)

*Primary Examiner* — Courtney Smith
(74) *Attorney, Agent, or Firm* — Crowell & Moring LLP

(57) ABSTRACT

In order to achieve reduction in loss, a semiconductor power module comprises DC terminals to be connected to a condenser module and the semiconductor power module is used in combination with a cooling jacket for cooling, and the DC terminals protrude toward the condenser module beyond the cooling jacket.

14 Claims, 14 Drawing Sheets

(56) References Cited

FOREIGN PATENT DOCUMENTS

| | | |
|---|---|---|
| DE | 10 2009 012 042 A1 | 9/2010 |
| EP | 1 863 156 A1 | 12/2007 |
| JP | 2001-286156 A | 10/2001 |
| JP | 2001-308246 A | 11/2001 |
| JP | 2007-295765 A | 11/2007 |
| JP | 2008-206243 A | 9/2008 |
| JP | 2009-44891 A | 2/2009 |
| JP | 2009-219270 A | 9/2009 |
| JP | 2010-119299 A | 5/2010 |
| JP | 2010-119300 A | 5/2010 |

OTHER PUBLICATIONS

German Office Action with English translation dated Nov. 22, 2012 (twenty (20) pages).

Chinese Office Action dated Feb. 1, 2013 (seven (7) pages).

* cited by examiner

RELATIONSHIP BETWEEN CLEARANCE AND RATIO OF THERMAL RESISTANCE

RELATIONSHIP BETWEEN CLEARANCE AND RATIO OF PRESSURE DROP

SEMICONDUCTOR POWER MODULE, INVERTER/CONVERTER INCLUDING THE SAME, AND METHOD OF MANUFACTURING A COOLING JACKET FOR SEMICONDUCTOR POWER MODULE

BACKGROUND OF THE INVENTION

The present invention relates to a semiconductor power module, on which power semiconductor elements such as insulated-gate bipolar transistors (referred below to as IGBT) or the like are mounted, an inverter/converter including the same, and a method of manufacturing a cooling jacket for mounting the semiconductor power module.

It is required that a semiconductor power module used for inverter/converters mounted on a wind power generator be efficiently cooled because of a large amount of heat generation, and liquid cooling is effective as cooling means therefor. The liquid cooling is accomplished usually by bonding fins to a semiconductor power module with, for example, thermal grease therebetween and immersing the fins in a flow passage of cooling water. However, the thermal grease has a disadvantage that it is large in thermal resistance as compared with metals.

In contrast, in order to ensure a higher cooling capability, there is known a semiconductor power module of direct-cooling method, in which heat is transferred to parts being cooled, without thermal grease therebetween, to achieve cooling (refer to, for example, JP-A-2007-295765 and JP-A-2009-44891).

With the semiconductor power module of direct-cooling method, a power semiconductor element(s) is mounted directly on an upper surface of a heatsink with an insulated layer therebetween and fins are provided on an underside of the heatsink. Hereupon, owing to that construction, in which an opening on the upper surface of the cooling jacket is covered and closed by the underside of the heatsink, the underside of the heatsink is brought into direct contact with a cooling water, so that the heatsink is improved in cooling effect.

In JP-A-2007-295765 and JP-A-2009-44891, connection to motor(s) mounted on a vehicle is assumed, and a condenser module is provided on a separate surface from a cooling jacket and having the same foot-print size as that of the cooling jacket, which is covered and closed by the heatsink of the semiconductor module, except an inlet/outlet whereby an inverter/converter is made minimum in foot-print size.

Since the condenser module is provided on the separate surface from the cooling jacket, however, an interconnection length of a conducting plate for connection between a DC terminal of the semiconductor module and a DC terminal of the condenser module is lengthened by a difference in level between a plane of the cooling jacket and a plane of the condenser module. When the interconnection length of the conducting plate is lengthened, an increase in value of resistance is brought about in proportion to the length to cause an increase in loss.

In such case, since an inductance making a current-resistance is further increased, for example, between a condenser of a DC circuit and IGBT, jump-voltage is generated with a change in current in switching and thus there is suggested a possibility that IGBT is broken in the case where the rated voltage of IGBT is exceeded.

JP-A-2008-206243 discloses a construction, in which a condenser module is arranged on the same plane as that of a cooling jacket, in which a heatsink of a semiconductor module is covered and closed from laterally. As compared with the disclosure of JP-A-2007-295765 and JP-A-2009-44891, a decrease in inductance can be achieved by shortening a wiring distance between a condenser and IGBT but assembling is problematically poor in quality because of that construction, in which the semiconductor module is mounted from laterally.

JP-A-2009-219270 discloses a construction, in which an opening on an upper surface of a cooling jacket is covered and closed by the use of a flange portion of a semiconductor module of a double-sided direct cooling method, in which a power semiconductor element is interposed by two heatsinks, and a condenser module is arranged on substantially the same plane as that of the cooling jacket. As compared with the disclosure of JP-A-2007-295765 and JP-A-2009-44891, a decrease in inductance can be achieved by shortening a wiring distance between a condenser and an IGBT but scattering in cooling performance becomes problematically large since a gap tolerance between the heatsinks and the cooling jacket becomes large in the case where the condenser module is not high in accuracy of positioning relative to the cooling jacket.

SUMMARY OF THE INVENTION

In connection with the technical problems described above, the invention is mainly directed to provide a semiconductor power module capable of reduction in loss and a method of manufacturing a cooling jacket for mounting the semiconductor power module.

In order to attain the above-described objects, a semiconductor power module of the invention comprises a DC terminal being connected to a condenser module, and is used in combination with a cooling jacket for cooling, wherein the DC terminal protrudes toward the condenser module beyond the cooling jacket.

Further, the invention provides a method of manufacturing a cooling jacket for mounting a semiconductor power module, the cooling jacket being provided with an opening at a site, at which a heatsink of the semiconductor power module is mounted, the module comprising an insulated substrate on which a plurality of power semiconductor elements are mounted, the heatsink for release of heat generated from the plurality of power semiconductor elements, a DC terminal, through which a DC current is supplied to the power semiconductor elements, and an AC terminal, through which an AC current is taken out from the power semiconductor elements, and including a chuck for machining, an inlet pipe, an outlet pipe, and bolt holes for fastening the semiconductor power module, wherein the cooling jacket is integrally molded by means of casting and then subjected to machining of the inlet pipe, the outlet pipe, and the bolt holes for fastening of the semiconductor power module to have a wall surface having a draft angle of 1° or more.

According to the invention, it is possible to provide a semiconductor power module capable of reduction in loss and a method of manufacturing a cooling jacket for mounting the semiconductor power module.

Other objects, features and advantages of the invention will become apparent from the following description of the embodiments of the invention taken in conjunction with the accompanying drawings.

DETAILED DESCRIPTION OF THE INVENTION (A first embodiment)

Embodiments of the invention will be described hereinafter with reference to the drawings.

Figure 1:
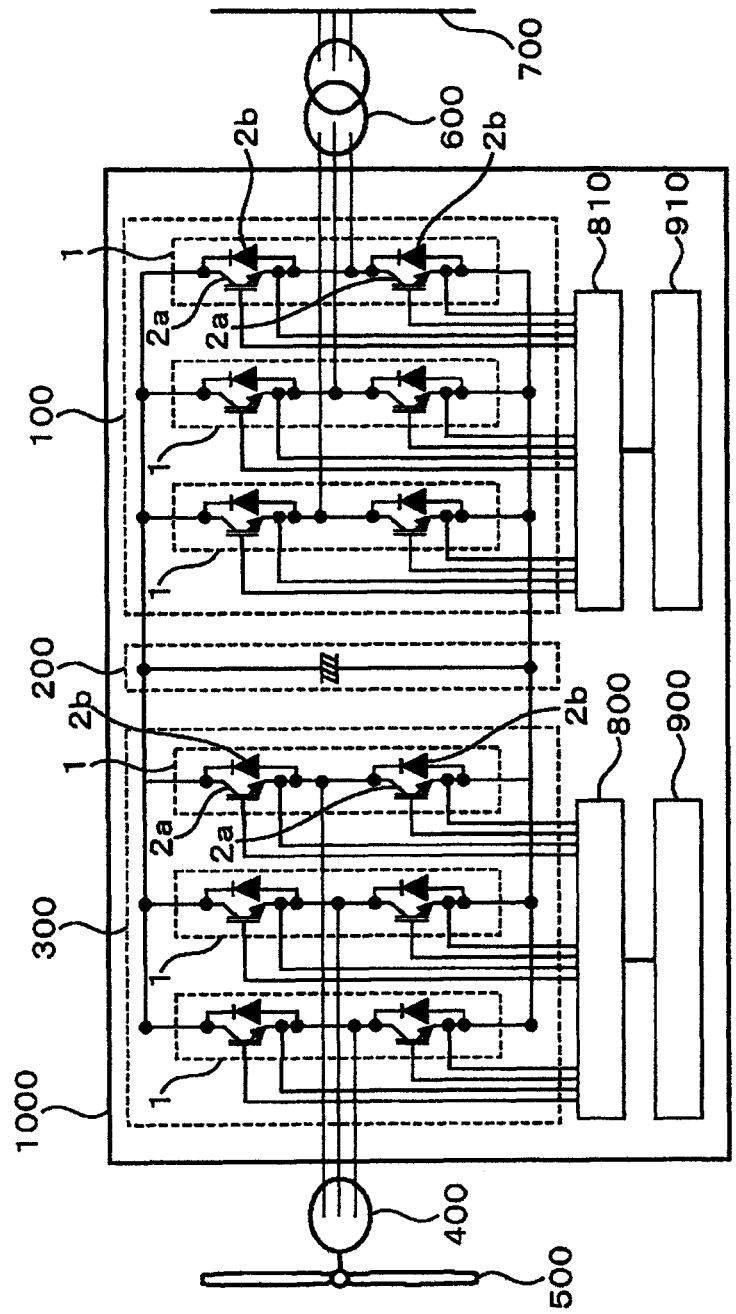
FIG. 1 is a view showing a circuit block configuration of an inverter/converter according to a first embodiment of the invention.

FIG. 1 is a view showing an example of a circuit block configuration of an inverter/converter according to a first embodiment of the invention. As shown in FIG. 1, an inverter/converter 1000 is connected to a blade 500 and a transformer 600 to comprise the blade 500, which is rotated by wind power, a generator 400, which generates an AC current from torque obtained by the blade 500, a converter module 300, which converts an AC current supplied from the generator 400 into a DC current, a condenser module 200, which stabilizes and flattens a DC current supplied from the converter module 300, and an inverter module 100, which generates an AC current of a predetermined frequency from a DC current. The AC current obtained from the inverter/converter is converted into a predetermined voltage by the transformer 600 to be fed to an external, electric power system.

In the converter module 300 and the inverter module 100, two current switching circuits comprising a parallel connection circuit of an IGBT 2a and a diode 2b are connected in series to constitute each upper/lower arm series circuit 1. Upper and lower ends of the upper/lower arm series circuits 1, respectively, are connected to positive and negative electrodes of the condenser module 200. A current switching circuit arranged on an upper side (positive electrode side) and comprising the IGBT 2a and the diode 2b acts as a so-called upper arm and a current switching circuit arranged on a lower side (negative electrode side) and comprising the IGBT 2a and the diode 2b acts as a so-called lower arm.

The inverter module 100 comprises a so-called 3 phase bridge circuit including three sets of the upper/lower arm series circuits 1. Three phase AC currents u, v, w are output from midpoint positions of the upper/lower arm series circuits 1, that is, connected portions of the upper/lower current switching circuits, and the three phase AC currents u, v, w thus output are fed to the transformer 600.

Also, the converter module 300 constitutes an inverter circuit comprising three upper/lower arm series circuits 1 and includes a converter module driver circuit 800, which drivingly controls the converter module 300, and a converter module control circuit 900, which supplies a control signal to the converter module driver circuit 800. Likewise, the inverter module 100 constitutes an inverter circuit comprising three upper/lower arm series circuits 1 and includes an inverter module driver circuit 810, which feeds a gate signal to the IGBTs 2a of respective phases to drivingly control the inverter module 300, and an inverter module control circuit 910, which feeds a control signal to the inverter module driver circuit 810. Here, gate signals output from the both driver circuits 800, 810 are fed to the IGBTs 2a of respective phases to control amplitudes and phases of the AC currents u, v, w.

The respective control circuits 900 comprise a microcomputer, which performs arithmetic processing of a switch timing of each IGBT 2a. Incidentally, emitter terminals of the IGBTs 2a of the respective arms are connected to the respective driver circuits 800, 810. The respective driver circuits 800, 810 conduct an overcurrent detection in the emitter terminal every IGBT 2a. A switching action of that IGBT 2a for which an overcurrent is detected is stopped and is protected from the overcurrent. Further, signals from temperature sensors (not shown), which are provided on the upper/lower arm series circuits 1, detectors, which detect DC voltages applied to both ends of the upper/lower arm series circuits 1, etc. are input to the respective control circuits 900, 910. On the basis of the signals, an abnormality such as an excessive temperature, an overvoltage, etc. are detected. In the case that an abnormality such as excessive temperature, overvoltage, etc. is detected, all the IGBTs 2a are stopped in switching action whereby the upper/lower arm series circuits 1 are protected against overcurrent, overvoltage, excessive temperature, etc. In addition, in the inverter/converter 1000 as described above, MOSFET (Metal Oxide Semiconductor Field Effect Transistor) may be used to constitute the current switching circuits comprising the IGBT 2a and the diode 2b. Also, the inverter module 100 may be constructed to comprise two upper/lower arm series circuits 1 to output two-phase AC current. Likewise, the converter module 300 may be constructed to comprise two upper/lower arm series circuits 1 to which two-phase AC currents are input. Further, in addition to the circuit configuration shown in FIG. 1, the inverter/converter 1000 may be one including a function of charging a battery with electricity. Also, in addition to the circuit configuration shown in FIG. 1, a speed-increasing gear may be provided to convert the rotational frequency of a wind mill into the rotational frequency of a generator.

Figure 2:
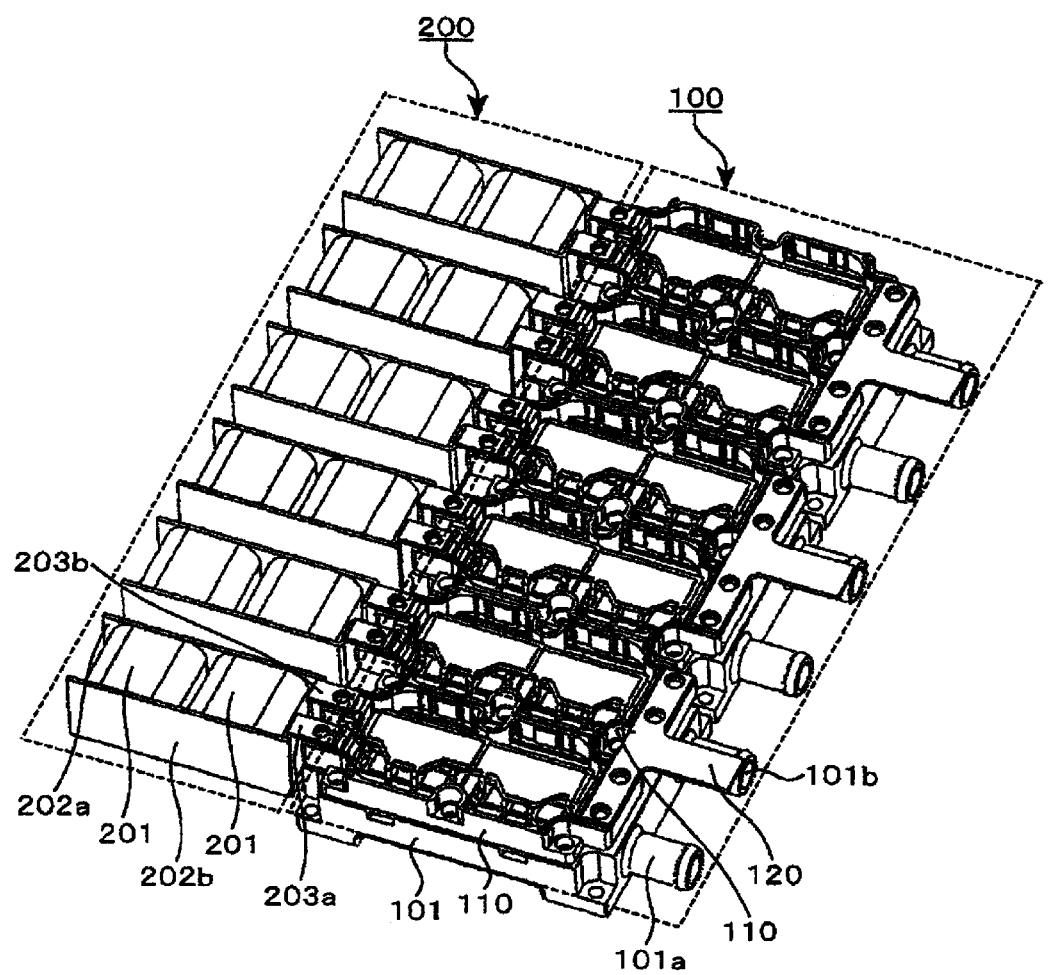
FIG. 2 is a perspective view showing an external appearance of a condenser module and an inverter module of the inverter/converter according to the first embodiment of the invention.

FIG. 2 is a perspective view of an external appearance of the condenser module 200 and the inverter module 100 of the inverter/converter according to the first embodiment of the invention. As shown in FIG. 2, the condenser module 200 and the inverter module 100 are electrically connected to each other by positive conducting plates 203a and negative conducting plates 203b. A plurality of condenser cells 201 are mounted on the condenser module 200, positive conducting plates 202a and negative conducting plates 202b are arranged in a manner to interpose the respective condenser cells 201, and respective conducting plates are connected to the positive conducting plates 203a and the negative conducting plates 203b. The inverter/converter 1000 mainly comprises semiconductor power modules and cooling jackets 101, openings of which are closed by the semiconductor power modules 110. An inlet pipe 101a and an outlet pipe 101b are integrally formed with the cooling jacket and a refrigerant is supplied through the inlet pipe 101a and taken out from the outlet pipes 101b. In an example shown in FIG. 2, two semiconductor power modules 110 of two in one type every phase are provided in locations corresponding to the upper/lower arm series circuits 1 shown in FIG. 1. Consequently, in order to output three phase AC currents u, v, w, six semiconductor power modules of two in one type are prepared and AC current supplying conducting plates 120 are provided in a manner to couple two power modules.

Since all the cooling jackets 101 and all the semiconductor power modules 110, which constitute three phases, are the same in construction, the detailed construction will be described with reference to the drawings (FIGS. 3 to 10), in which two semiconductor power modules 110 are mounted on a cooling jacket for one phase.

Figure 3:
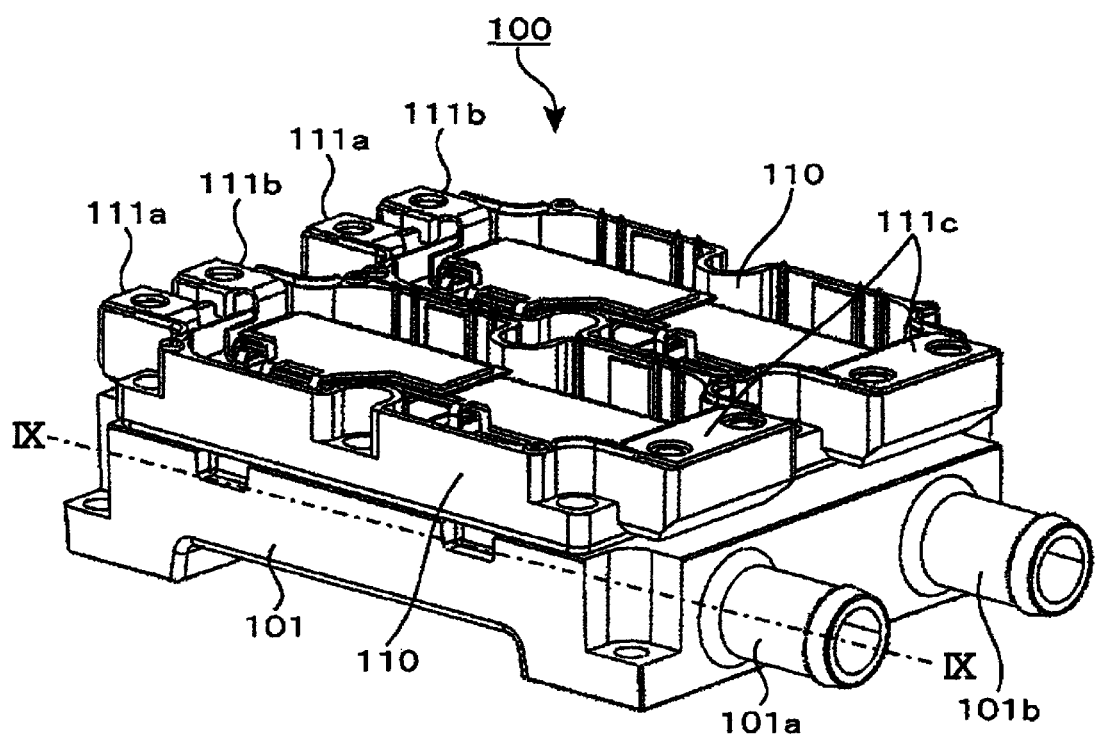
FIG. 3 is a perspective view showing an external appearance of a single phase inverter module according to the first embodiment of the invention.
Figure 4:
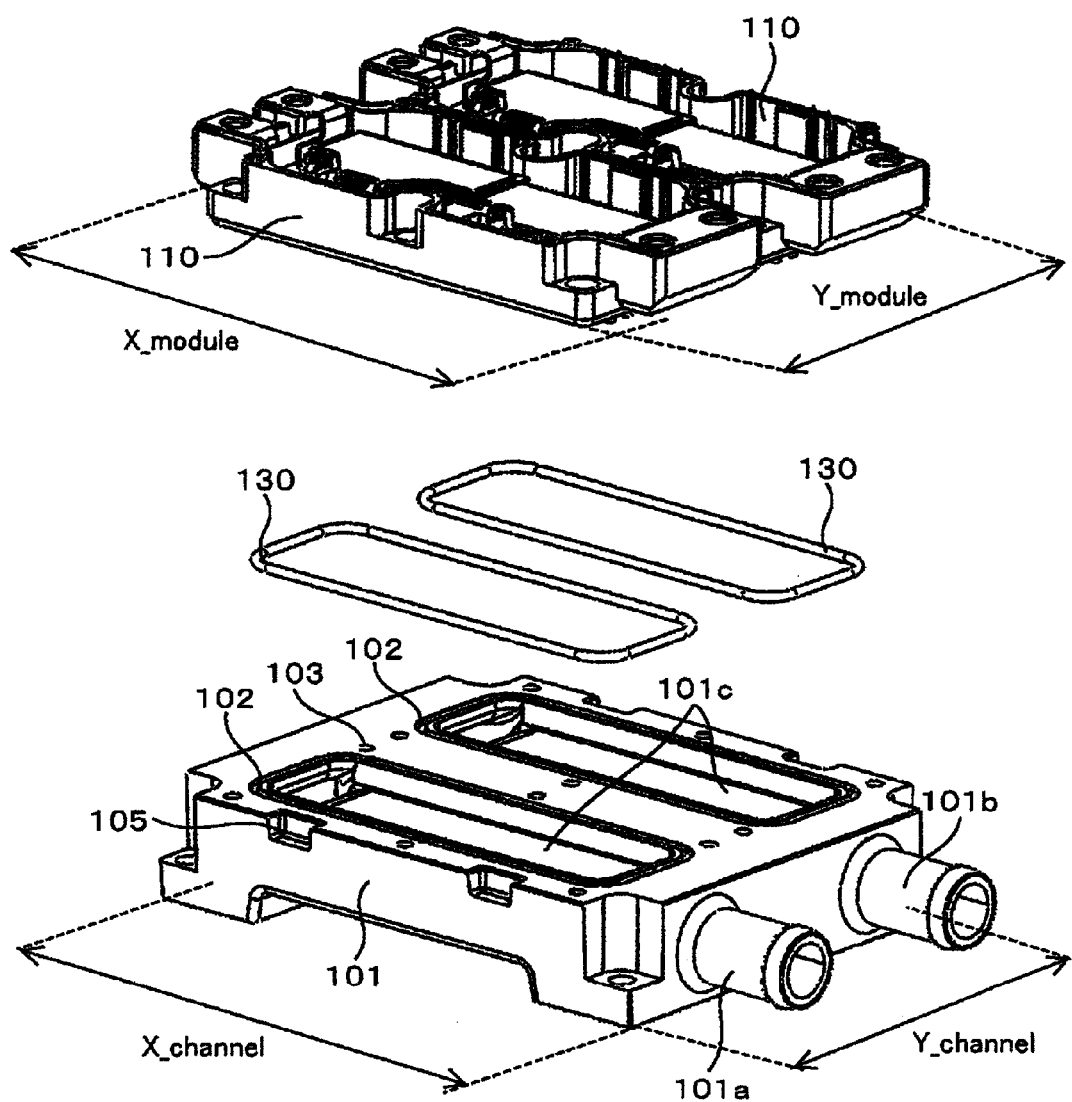
FIG. 4 is an exploded, perspective view showing the single phase inverter module according to the first embodiment of the invention.

FIG. 3 is a perspective view of an external appearance of the inverter module 100 for one phase, according to the first embodiment of the invention, and FIG. 4 is an exploded view of the inverter module 100 shown in FIG. 3. The inverter module 100 is formed by providing the semiconductor power module 110 by the passage of bolts through semiconductor power module fixation bolt holes 103 with sealing materials 130, which are typified by an O-ring, therebetween so as to close openings 101c positioned on an upper surface of the cooling jacket 101. Since the O-rings 130 and the semiconductor power modules 110 are mounted from the above, it is prevented for the O-rings 130 from dismounting from O-ring grooves 102 at the time of assembling, whereby assembling is improved in quality.

The cooling jacket 101 is integrally molded by means of casting (including die-casting), and the O-ring grooves 102, the semiconductor power module fixation bolt holes 103, the inlet pipe 101a, and the outlet pipe 101b are subjected to machining after the casting. Chucks 105 for machining are used when the cooling jacket is fixed to a finishing machine at the time of machining, and by providing the chucks for machining outside the O-ring grooves 102, reliability in sealing is characteristically maintained. Also, integral molding of the cooling jacket improves reliability in sealing to lead to miniaturization and reduction in cost.

In addition, instead of O-rings, liquid gaskets and metal gaskets may be used for sealing.

Figure 8:
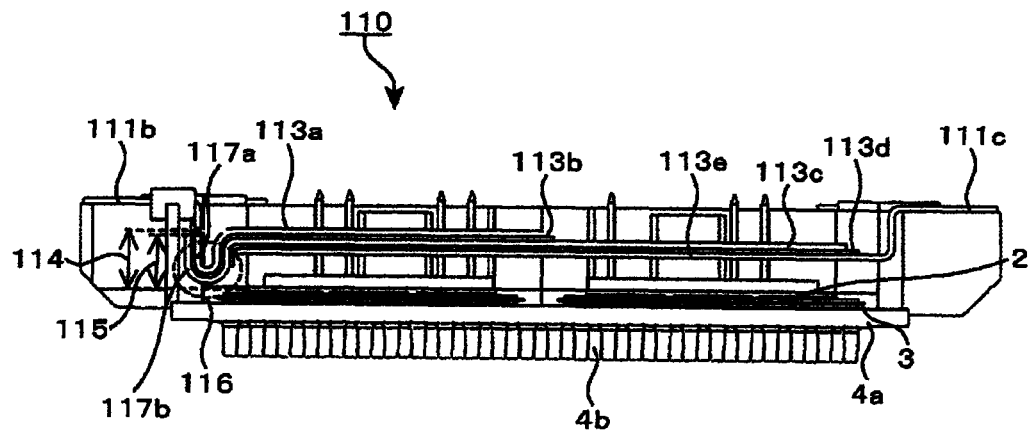
FIG. 8 is a cross sectional view taken along a line VIII-VIII in FIG. 7.

As shown in FIG. 3, the semiconductor power module 110 comprises a semiconductor power module body, DC terminals, and an AC terminal, and a positive electrode DC terminal 111a and a negative electrode DC terminal 111b ringare provided on one side of the semiconductor power module body, an AC terminal 111c is provided at an opposite side. Since power semiconductor elements (IGBT or diode) 2 are not present just below these terminals as shown in FIG. 8, there is no need of providing a heatsink 4 just below the terminals and when the cooling jacket 101 is arranged on an underside of the semiconductor power module body, it is possible to produce a cooling effect. Therefore, by arranging a flow passage 106, which connects between openings of the cooling jacket, just below the DC terminals and the AC terminals of the semiconductor power modules 110, it is possible to increase the flow passage 106 in space efficiency and to make a foot-print size (X_channe×Y_channel) of the cooling jacket 101, on which the semiconductor power modules 110 are mounted, except the inlet/outlet pipes 101a, 101b equal to or less than a foot-print size (X_module×Y_module) of the semiconductor power modules 110. Also, the positive electrode DC terminals 111a and the negative electrode DC terminals 111b are connected to the condenser module 200. The positive electrode DC terminals 111a and the negative electrode DC terminals 111b protrude toward the condenser module 200 from the cooling jacket 101 to shorten an interconnection length required for contact with the condenser module.

Consequently, the condenser module 200 can be arranged flush with and adjacent to the semiconductor power modules 110, so that it is possible to shorten the length of the conducting plate 203 for connection between the condenser module 200 and the semiconductor power module 110 and to decrease an inductance, which makes a current resistance. Therefore, it is possible to reduce the apparatus in loss and to prevent a jump-voltage attendant upon a change in current in switching to prevent breakage of the IGBTs.

Figure 5:
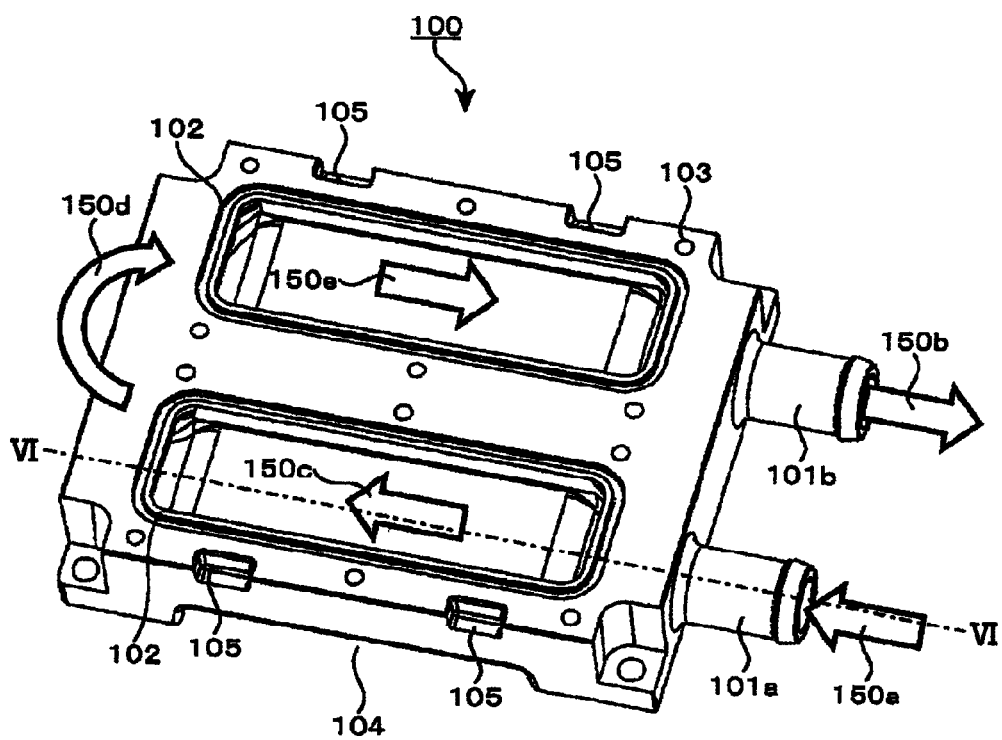
FIG. 5 is a perspective view showing a cooling jacket according to the first embodiment of the invention and an advancing direction of a refrigerant.

FIG. 5 is a view showing the cooling jacket 101 according to the first embodiment of the invention and an example of an advancing direction of a refrigerant. The refrigerant flows into the cooling jacket 101 from the inlet pipe 101a in an advancing direction 150a of the refrigerant in the inlet pipe to advance in the jacket opening 101c, into which the heatsink 4 of a first semiconductor power module 110 is inserted, in an advancing direction 150c of the refrigerant in the heatsink to change its advancing direction in the flow passage 106, which connects between the openings of the cooling jacket, in an advancing direction 150d of the refrigerant in the flow passage, to advance in the jacket opening 101c, into which the heatsink 4 of a second semiconductor power module 110 is inserted, in an advancing direction 150e of the refrigerant in the heatsink in opposition to the advancing direction 150c of the refrigerant in the first heatsink and flows out from the cooling jacket 101 through the outlet pipe 101b in an advancing direction 150b of the refrigerant in the outlet pipe.

Figure 6:
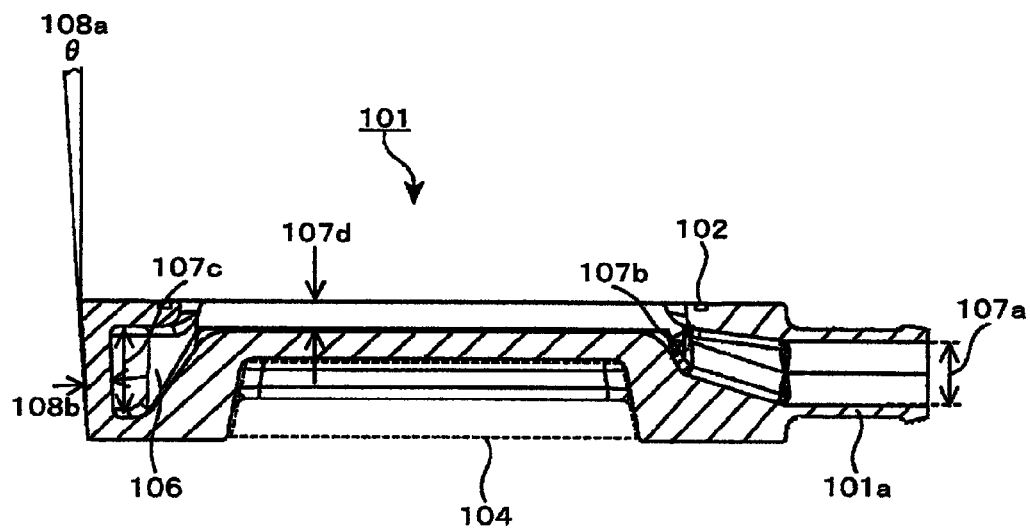
FIG. 6 is a cross sectional view taken along a line VI-VI in FIG. 5.

FIG. 6 is a cross sectional view taken along a line VI-VI in FIG. 5. Since the cooling jacket is integrally molded by means of casting, it characteristically has a draft angle of 1° or more and a wall thickness 108b, on which the draft angle is present, of 3 mm or more. The jacket openings 101c, into which the heatsinks 4 of the semiconductor power module 110 are inserted, are made to have an opening channel cross sectional area 107d smaller than an inlet/outlet pipe channel cross sectional area 107a, a nozzle minimum portion channel cross sectional area 107b, and a module in-between channel cross sectional area 107c whereby only locations being to be cooled (the jacket openings 101c, into which the heatsinks 4 are inserted) are increased in velocity of flow to achieve an improvement in cooling performance and locations not contributing to cooling (the inlet pipe 101a, the outlet pipe 101b, the flow passage 106, which connects between the openings of the cooling jacket) are decreased in velocity of flow to achieve a decrease in pressure drop. Further, it is possible to provide a space 104 at a bottom surface of the cooling jacket, where no channel for the refrigerant is provided, with a view to lightening.

Also, since a material of the cooling jacket is generally an aluminum alloy and a material of the heatsinks 4 is copper, for the purpose of prevention of galvanic corrosion, the cooling jacket and the heatsinks 4 are subjected to surface preparation to prevent the corrosion. Also, impregnation is applied to pour a resin into cavities of the molding and gaps of sintered parts to cure the same, thus enabling filling unnecessary holes thereof, so that an improvement in reliability is achieved.

Figure 7:
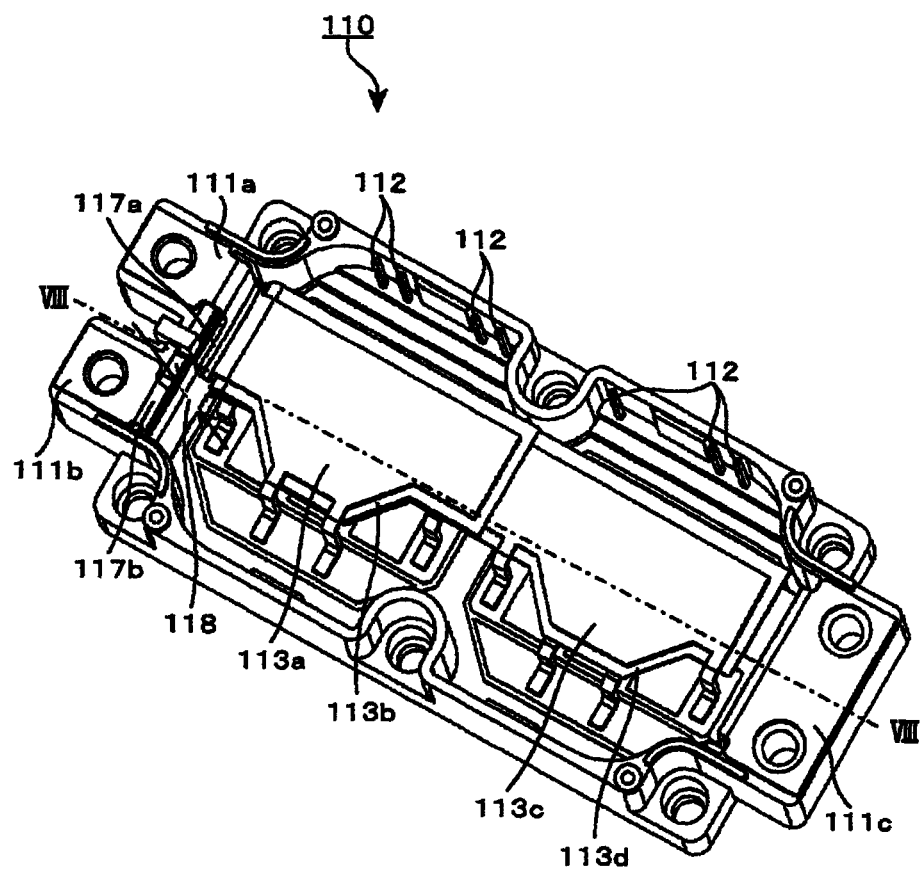
FIG. 7 is a perspective view showing an external appearance of a semiconductor power module according to the first embodiment of the invention.

FIG. 7 is a perspective view of an external appearance of the semiconductor power module 110 according to the first embodiment of the invention, and FIG. 8 is a cross sectional view taken along line VIII-VIII in FIG. 7. By providing the positive electrode DC terminal 111a and the negative electrode DC terminal 111b on one side of the semiconductor power module body, providing the AC terminal 111c on the other side opposite to the side, on which the DC terminals are arranged, and providing low-voltage (gate signal, temperature detection signal, emitter signal) electrodes 112 on a separate side from the sides, on which high-voltage terminals (DC and AC terminals 111) are provided, it is possible to separate the low-voltage system from the high-voltage system, so that it is possible to prevent noise of respective signals (gate signal, temperature detection signal, emitter signal).

In order to supply an electric current to the power semiconductor elements 2 from the high-voltage terminals (DC and AC terminals 111), a laminated flat plate 113 is provided above the power semiconductor elements 2. The laminated flat plate 113 is formed by laminating a negative electrode conducting plate 113a, an insulating material 113b, a positive electrode conducting plate 113c, an insulating material 113d, and an AC conducting plate 113e in this order from above in a layering manner. The negative electrode conducting plate 113a and the positive electrode conducting plate 113c are arranged in parallel with the insulating material 113b therebetween and the same but reversely directed electric current flows therethrough. Consequently, magnetic fields generated by mutual electric currents cancel each other in a space between the negative electrode conducting plate 113a and the positive electrode conducting plate 113c, with the result that inductance of the current path is decreased. In addition, the insulating material 113b (113d) is provided for the purpose of electric insulation of respective conducting plates (the negative electrode conducting plate 113a, the positive electrode conducting plate 113c, the AC conducting plate 113e) and is mounted by means of a method of bonding an insulating paper to a conducting plate, and a method of laminate-coating a conducting plate.

Also, when viewed from above, the laminated flat plate is substantially trapezoidal in shape and is characterized in shape such that electric current flows toward respective terminals connected to a metallic pattern on the insulating substrate in low inductance.

While shown only in FIG. 8, a gel is sealed inside the semiconductor power module for the purpose of prevention of attachment of dust to internal parts such as the power semiconductor elements 2, fixation, maintenance of insulation performance, or the like. The gel is filled to accumulate above a bottom surface of a topmost conducting plate (the negative electrode conducting plate 113a in the embodiment) of the laminated flat plate 113 whereby it is possible to ensure an insulation performance relative to other conducting plates.

A creeping distance between the positive electrode DC terminal 111a and the negative electrode DC terminal 111b is made at least 10 mm and so there is no need for any insulating material therebetween. On the other hand, since the positive electrode conducting plate 113c and the negative electrode conducting plate 113a are disposed adjacent to each other, there is a need for an insulating material therebetween in order to ensure an insulation performance and it is required that at least one of the conducting plates is received in the gel. Therefore, in order to ensure an insulation performance, it is required that a level 114 of a gel surface at a site 117a for connection of the positive electrode DC terminal 111a to the positive electrode conducting plate 113c and a site 117b for connection of the negative electrode DC terminal 111b to the negative electrode conducting plate 113a be higher than a level 115 of a site, at which a creeping distance between the positive electrode conducting plate and the negative electrode conducting plate is shortened.

On the other hand, a plate width 118 of a minimum neck portion of the site 117a for connection of the positive electrode DC terminal 111a to the positive electrode conducting plate 113c should be made at least equal to or larger than 5 mm for the sake of vibration resistance and low inductance. Hereupon, by making the minimum neck portion a conducting plate 116, which is semi-circular in shape to have a curvature, it is made possible to make the level 114 of the gel surface higher than the level 115 of that site, at which a creeping distance between the positive electrode conducting plate and the negative electrode conducting plate is shortened, without increasing the whole semiconductor module in level, thus enabling ensuring an insulation performance and decreasing a distance between the positive electrode DC terminal 111a and the laminated flat plate 113, with the result that it is possible to shorten a module length X_module shown in FIG. 4, thus enabling miniaturization of the semiconductor power module 110. In addition, while the gel is used in the present embodiment, a transfer mold may be used instead of the gel.

Figure 9:
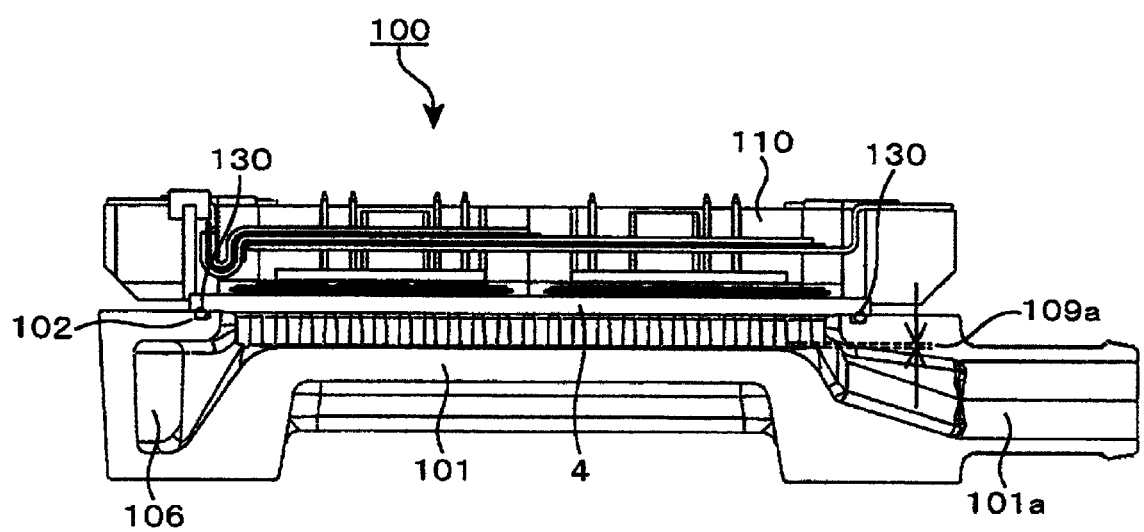
FIG. 9 is a cross sectional view taken along a line IX-IX in FIG. 3.

FIG. 9 is a cross sectional view of the single phase inverter module taken along IX-IX in FIG. 3. The inverter module 100 is formed by inserting the semiconductor power modules 110 into the cooling jacket 101. If the heatsinks 4 of the semiconductor power modules 110 are brought into contact with the cooling jacket when the semiconductor power modules 110 are mounted to the cooling jacket 101, the O-rings 130 are not fully compressed and cannot ensure an insulation performance. Therefore, it is necessary to ensure a predetermined distance 109a between the heatsinks 4 and the cooling jacket 101. On the other hand, since the distance 109a between fin tip ends of the heatsinks 4 shown in FIG. 9 and the cooling jacket 101 has an influence on the cooling performance (thermal resistance, pressure drop), control of the distance 109a between the fin tip ends of the heatsinks 4 and the cooling jacket 101, in addition to fabrication tolerance and mount tolerance, is important.

Figure 10A:
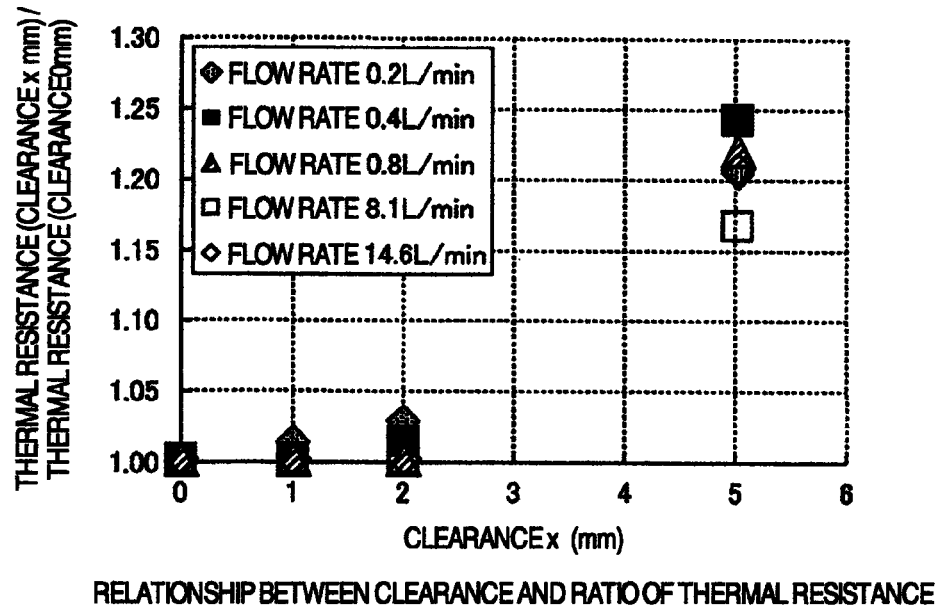
FIGS. 10A and 10B are graphs showing a relationship between a clearance and a ratio of thermal resistance, and between a clearance and pressure drop in the case where pin fin heatsinks are used.
Figure 10B:
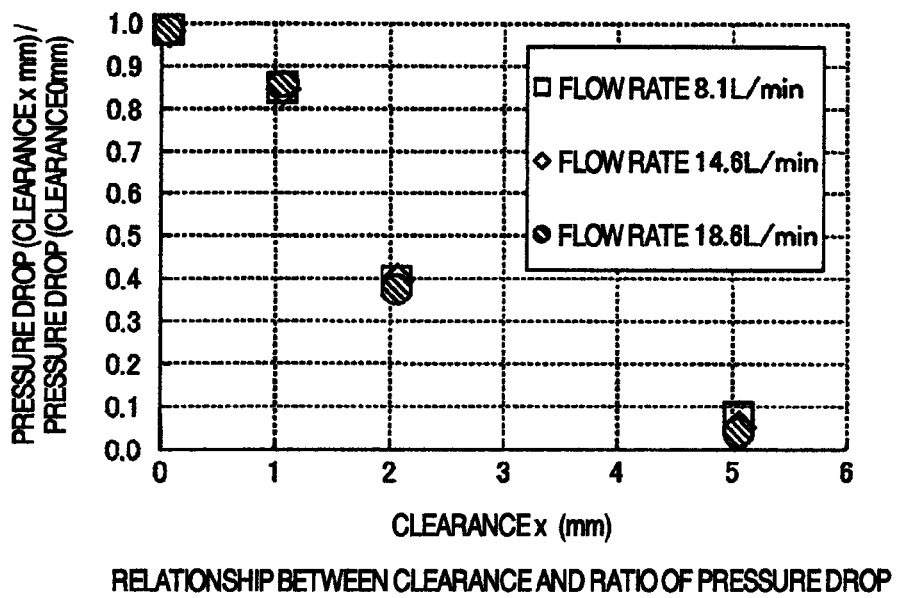

FIGS. 10A and 10B are graphs indicative of the relationship between the distance (described as fin-tip gap) between the fin tip ends of the heatsinks 4 and the cooling jacket 101, and thermal resistance and pressure drop. The graphs show a fin-tip gap on the axis of abscissa and a ratio of a performance when a fin-tip gap is present and when a fin-tip gap is zero, on the axis of ordinate. It is seen from FIGS. 10A and 10B that as fin-tip gap increases, the thermal resistance increases and the pressure drop decreases. Also, it is seen that when a fin-tip gap is equal to or less than 2.0 mm, an increase in thermal resistance is not large as compared with a decrease in pressure drop. Therefore, by specifying the fabrication tolerance and the mount tolerance so that the distance (fin-tip gap) 109a between the fin tip ends of the heatsinks 4 and the cooling jacket 101 is made at least 0.1 mm but at most 2.0 mm, the heatsinks 4 do not come into contact with the cooling jacket 101 and the cooling performance can be maintained.

In the present embodiment, the positive electrode DC terminals 111a and the negative electrode DC terminals 111b protrude toward the condenser module 200 beyond the cooling jacket 101 to shorten an interconnection length required for contact with the condenser module, thereby achieving a decrease in inductance and a decrease in pressure drop.

In the embodiment, while the inverter module 100 is shown as an example, it may be substituted by the converter module 300. Also, while heatsink fins 4b are shown in the form of a pin fin, they may comprise flat plate fins and corrugated fins. Also, the inverter/converter 1000 in the embodiment is suitable for wind power generation and besides applicable to inverter/converters for automobiles and trucks, inverter/converters for tramcars, ships, and airplanes, industrial inverter/converters used as control devices for motors, which drive shop facilities, and household inverter/converters used for control devices of motors, which drive household solar light generating systems and household electrification products.

(A second embodiment)

Figure 11:
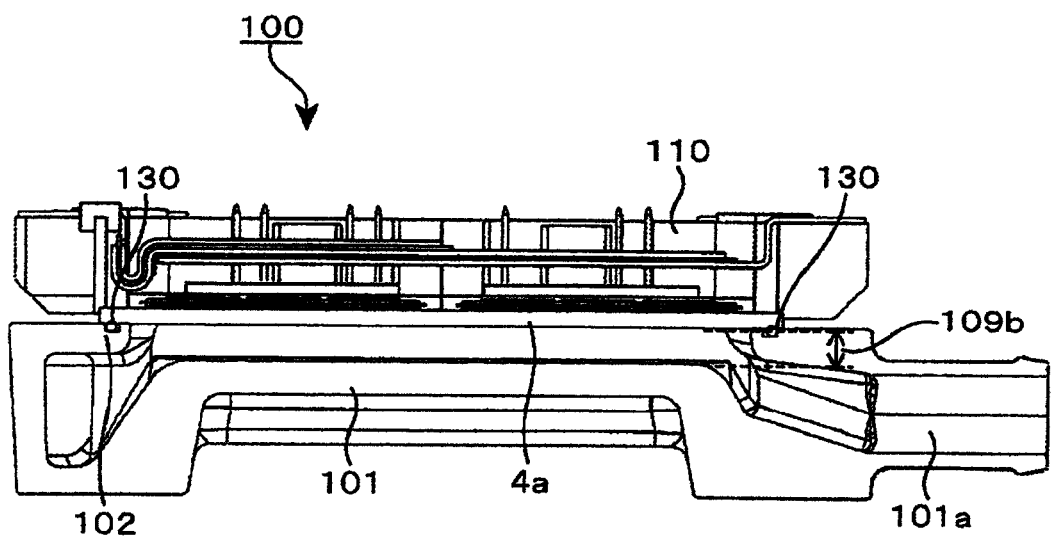
FIG. 11 is a cross sectional view, similar to FIG. 9, of a single phase inverter module when a heatsink without fins is mounted, according to a second embodiment of the invention.

FIG. 11 is a cross sectional view, similar to FIG. 6, of a single phase inverter module in the case where heatsinks without fins are mounted. As compared with the first embodiment, reduction in heating surface area is achieved according to an extent, to which the heatsink fins 4b are removed, to lead to degradation in cooling performance but reduction in cost is expected since heatsinks 4 can be made simple in shape provided that power semiconductor elements being an object to be cooled are cooled to a necessary extent. In this case, a distance 109b between heatsink bases 4a and the cooling jacket 101 is preferably at least 0.5 mm in view of prevention of dust clogging and prevention of cavitation erosion. For example, in the case where the width of a flow passage is 30 mm and the rate of flow is 1.0 L/min, an average flow velocity is about 1.1 m/s when the distance 109b between the heatsink bases 4a and the cooling jacket 101 is 0.5 mm, and thus the average flow velocity is smaller than a generally known allowable flow velocity (1.5 m/s), so that there is no fear of generation of cavitation erosion ([Bibliography] "Anti corrosion guide for copper pipes used in building pipe lines", Jpn. Copp. Develop. Assoc., page 16 (1987)).

(A third embodiment)

Figure 12:
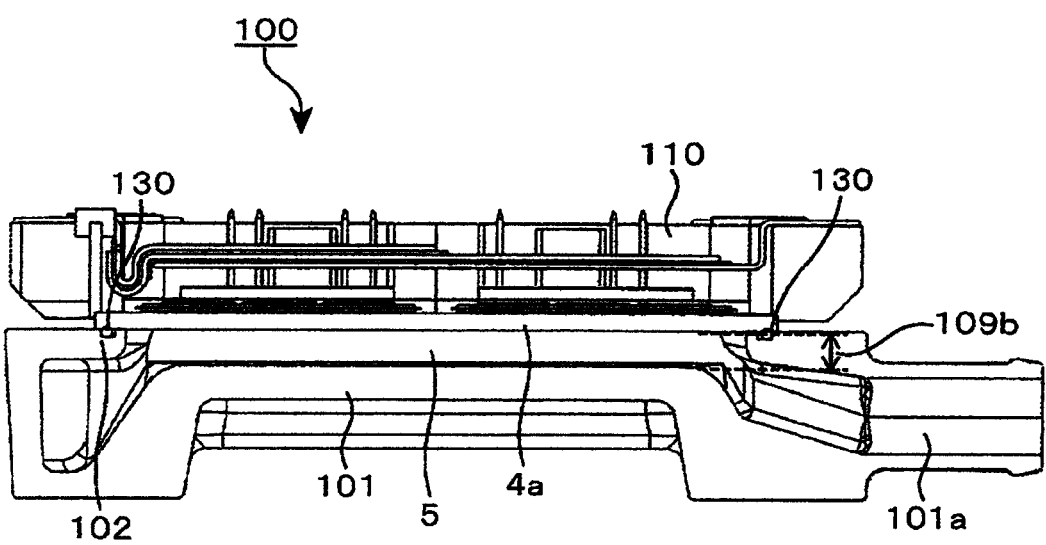
FIG. 12 is a cross sectional view, similar to FIG. 9, of a single phase inverter module when a heatsink without fins and a flow velocity increasing member are mounted, according to a third embodiment of the invention.

FIG. 12 is a cross sectional view, similar to FIG. 6, of a single phase inverter module in the case where heatsinks without fins are mounted and a flow velocity increasing member is provided. In the present embodiment, a flow velocity increasing member 5 is provided in addition to the second embodiment whereby heat transfer is made possible in a state of turbulence with Reynolds number of 2000 or more and an improvement in cooling performance can be achieved.

(A fourth embodiment)

Figure 13:
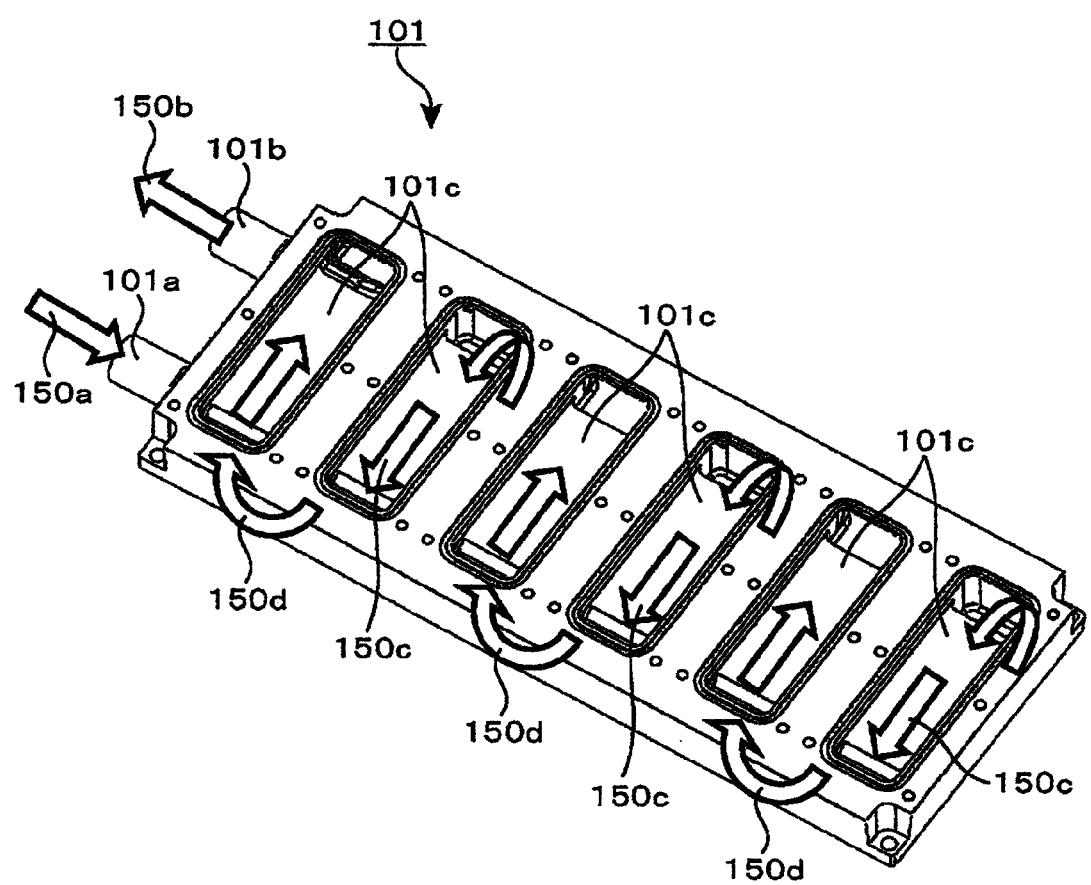
FIG. 13 is a perspective view showing a cooling jacket, on which two or more semiconductor modules are mounted, according to a fourth embodiment of the invention, and showing an example of an advancing direction of a refrigerant, which does not branch and merge.
Figure 14:
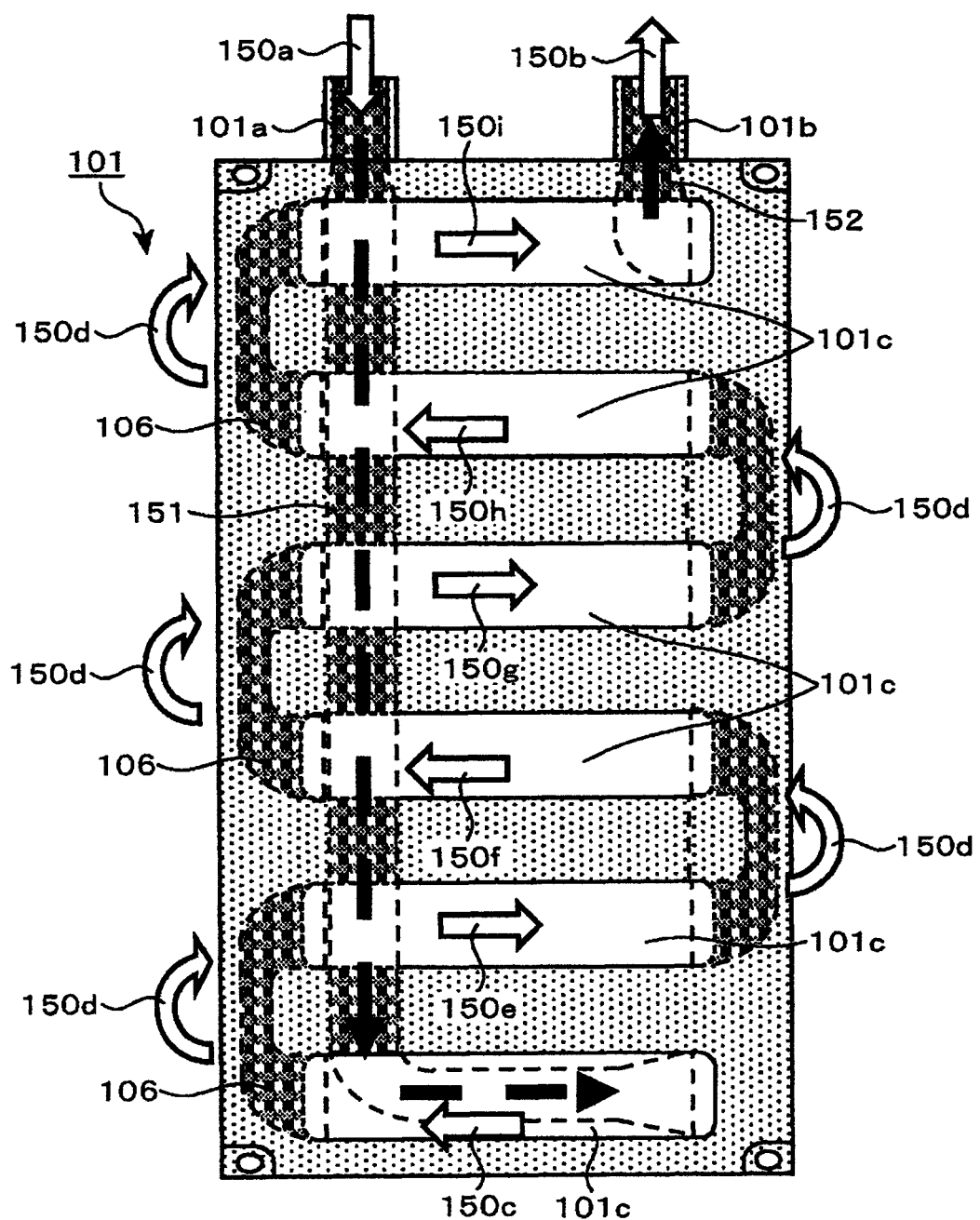
FIG. 14 is a plan view schematically showing the cooling jacket and the example of the advancing direction of the refrigerant shown in FIG. 13.

FIG. 13 is a view showing a cooling jacket, on which two or more semiconductor modules are mounted, and an example of an advancing direction of a refrigerant, which does not branch and merge, and FIG. 14 is a plan view schematically showing the cooling jacket and the example of the advancing direction of the refrigerant in FIG. 13.

The refrigerant flows into a cooling jacket 101 from an inlet pipe 101a in an advancing direction 150a of the refrigerant in the inlet pipe to flow in a lower layer of a semiconductor power module connected to the inlet pipe in an advancing direction 151 of that refrigerant in a flow passage, which flows in the lower layer of the semiconductor power module, to flow upward from under toward a jacket opening 101c, into which a heatsink 4 of a semiconductor power module 100 positioned in a location most distant from a surface provided thereon with the inlet pipe 101a and an outlet pipe 101b is inserted, to advance in an advancing direction 150c of the refrigerant in the heatsink to change its advancing direction in a flow passage 106, which connects between the openings of the cooling jacket, in an advancing direction 150d of the refrigerant in the flow passage, which connects between the openings of the cooling jacket, to advance in the jacket opening 101c, into which a heatsink 4 of a second semiconductor power module 110 is inserted, in an advancing direction 150e of the refrigerant in the heatsink in opposition to the advancing direction 150c of the refrigerant in the first heatsink to change its advancing direction in a flow passage 106, which connects between the openings of the cooling jacket, in an advancing direction 150d of the refrigerant in the flow passage, which connects between the openings of the cooling jacket, to advance in the jacket opening 101c, into which a heatsink 4 of a third semiconductor power module 110 is inserted, in an advancing direction 150f of the refrigerant in the heatsink in opposition to the advancing direction 150e of the refrigerant in the second heatsink, repetition of this procedure causes the refrigerant to flow in those jacket openings 101c, into which heatsinks 4 of fourth, fifth, and sixth semiconductor power modules 110 are inserted, in opposition to advancing directions 150 of the refrigerant in adjacent heatsinks to finally flow in a lower layer of a semiconductor power module connected to the outlet pipe in an advancing direction 152 of that refrigerant in a flow passage, which flows in the lower layer of the semiconductor power module, and the refrigerant flows out from the cooling jacket 101 through the outlet pipe 101b in an advancing direction 150b of the refrigerant in the outlet pipe. The present construction has a feature in that all the semiconductor power modules are coupled together by a single stroke flow passage. Branching and merging are not applied whereby it is unnecessary to take care in distribution with a uniform rate of flow and as compared a fifth and a sixth embodiment described later, in which branching and merging are applied, sites, at which the heatsinks 4 of the semiconductor power modules 100 are inserted, can be made maximum in flow velocity, so that it is possible to achieve a decrease in thermal resistance.

(A fifth embodiment)

Figure 15:
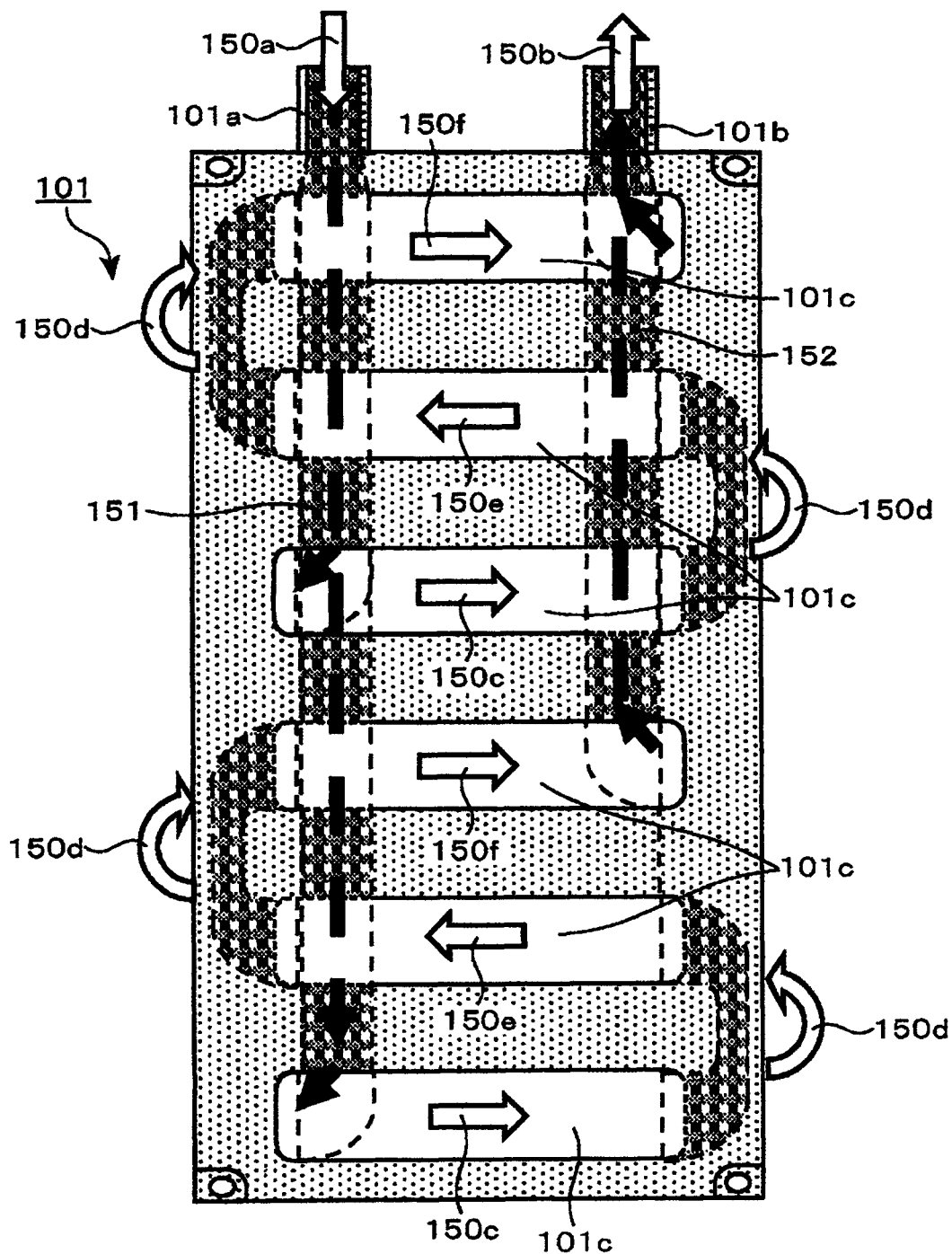
FIG. 15 is a plan view schematically showing a cooling jacket, on which two or more semiconductor modules are mounted, according to a fifth embodiment of the invention, and showing an example of an advancing direction of a refrigerant, which branches into two streams and merges from two streams.

FIG. 15 is a plan view schematically showing a cooling jacket, on which two or more semiconductor modules are mounted, and an example of an advancing direction of a refrigerant, which branches into two streams and merges from two streams.

The refrigerant flows into a cooling jacket 101 from an inlet pipe 101a in an advancing direction 150a of the refrigerant in the inlet pipe to flow in a lower layer of a semiconductor power module connected to the inlet pipe in an advancing direction 151 of that refrigerant in a flow passage, which flows in the lower layer of the semiconductor power module, to branch into two streams to flow upward from under toward a jacket opening 101c, into which a heatsink 4 of a semiconductor power module 100 is inserted, to advance in an advancing direction 150c of the refrigerant in the heatsink to change its advancing direction in a flow passage 106, which connects between the openings of the cooling jacket, in an advancing direction 150d of the refrigerant in the flow passage, which connects between the openings of the cooling jacket, to advance in the jacket opening 101c, into which a heatsink 4 of a second semiconductor power module 110 is inserted, in an advancing direction 150e of the refrigerant in the heatsink in opposition to the advancing direction 150c of the refrigerant in the first heatsink to change its advancing direction in a flow passage 106, which connects between the openings of the cooling jacket, in an advancing direction 150d of the refrigerant in the flow passage, which connects between the openings of the cooling jacket, to advance in the jacket opening 101c, into which a heatsink 4 of a third semiconductor power module 110 is inserted, in an advancing direction 150f of the refrigerant in the heatsink in opposition to the advancing direction 150e of the refrigerant in the second heatsink to flow in the lower layer of the semiconductor power module in an advancing direction 152 of that refrigerant in a flow passage, which flows in a lower layer of a semiconductor power module connected to an outlet pipe, to merge from two flow passages, and flows out from the cooling jacket 101 through the outlet pipe 101b in an advancing direction 150b of the refrigerant in the outlet pipe. In the present construction, since the number of branches is reduced as compared with the sixth embodiment described later, the rate of flow can readily be distributed equally to respective flow passages and sites, at which the heatsinks 4 of the semiconductor power modules 100 are inserted, can be increased in flow velocity, so that it is possible to achieve a decrease in thermal resistance.

(A sixth embodiment)

Figure 16:
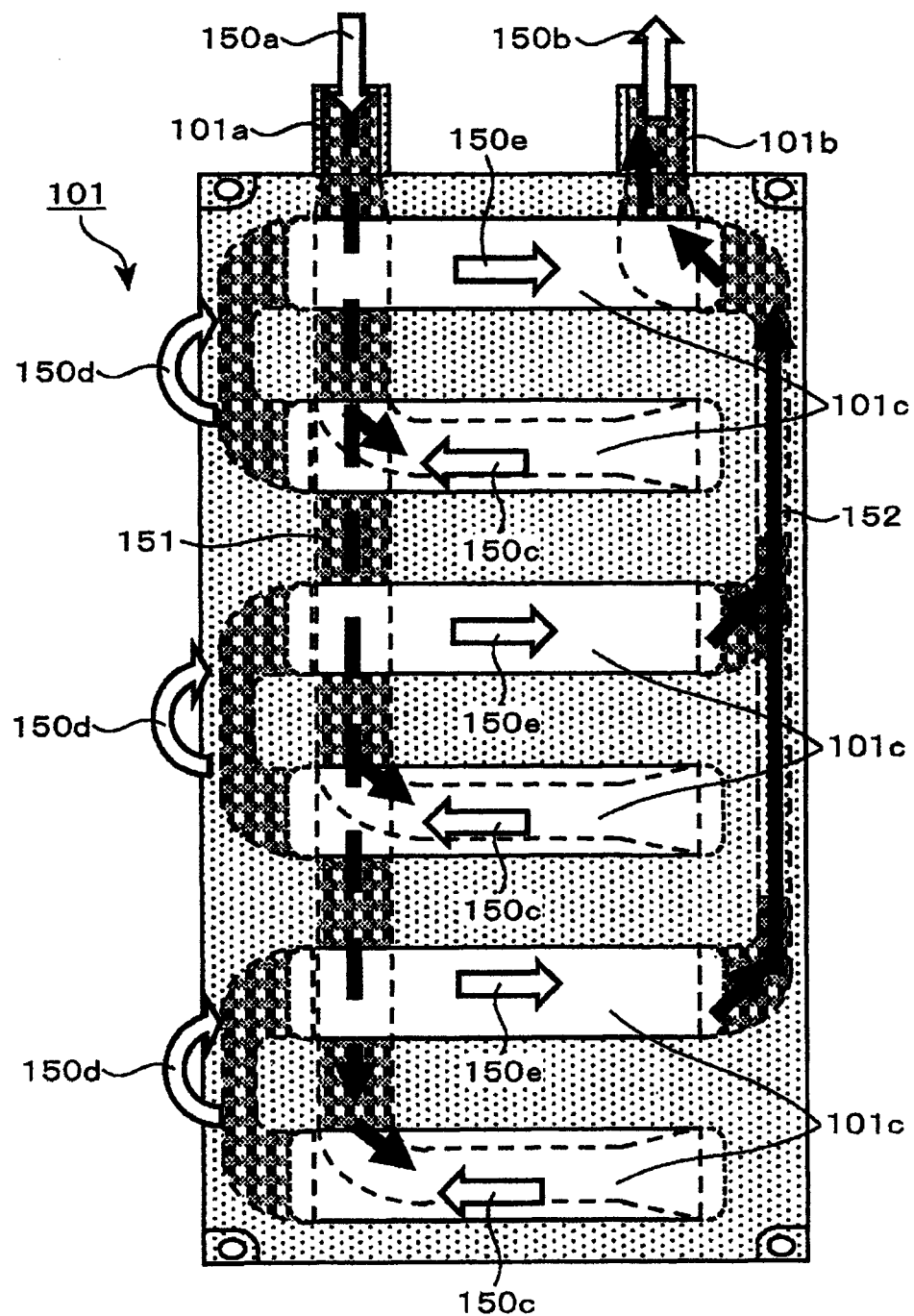
FIG. 16 is a plan view schematically showing a cooling jacket, on which two or more semiconductor modules are mounted, according to a sixth embodiment of the invention, and showing an example of an advancing direction of a refrigerant, which branches into three streams and merges from three streams.

FIG. 16 is a plan view schematically showing an example of a cooling jacket, on which two or more semiconductor modules are mounted, and an advancing direction of a refrigerant, which branches into three streams and merges from three streams. The refrigerant flows into the cooling jacket 101 from the inlet pipe 101a in the advancing direction 150a of the refrigerant in the inlet pipe to flow in a lower layer of a semiconductor power module connected to the inlet pipe 101a in an advancing direction 151 of that refrigerant in a flow passage, which flows in the lower layer of the semiconductor power module, to branch into three streams (respective phases of u, v, w) to flow upward from under toward a jacket opening 101c, into which a heatsink 4 of a semiconductor power module 100 is inserted, to advance in an advancing direction 150c of the refrigerant in the heatsink to change its advancing direction in a flow passage 106, which connects between the openings of the cooling jacket, in an advancing direction 150d of the refrigerant in the flow passage, which connects between the openings of the cooling jacket, to advance in the jacket opening 101c, into which a heatsink 4 of a second semiconductor power module 110 is inserted, in an advancing direction 150e of the refrigerant in the heatsink in opposition to the advancing direction 150c of the refrigerant in the first heatsink to flow in the lower layer of the semiconductor power module in an advancing direction 152 of that refrigerant in a flow passage, which flows in a lower layer of a semiconductor power module connected to an outlet pipe, to merge from three flow passages (respective phases u, v, w), and flows out from the cooling jacket 101 through the outlet pipe 101b in an advancing direction 150b of the refrigerant in the outlet pipe. In the present construction, since all six semiconductor modules 10 (each phase 2×3 phase=6) is cooled by a single cooling jacket 101 in order to obtain three phase AC current, it is made possible to reduce the number of couplers (not shown) mounted to the inlet pipe 101a and the outlet pipe 101b to achieve an improvement in reliability and to make the number of couplers only 2, thereby realizing reduction in cost. Also, there is an advantage that the respective three phases (u, v, w) can be cooled under the same condition. In addition, while the refrigerant passes through the respective modules to get an amount of heat to rise in liquid temperature as it advances toward the outlet pipe 101b from the inlet pipe 101a, the refrigerant flows in an opposite direction so as to cancel influences of the liquid temperature rise, so that the cooling jacket is preferably molded from a metal having a high thermal conductivity.

(A seventh embodiment)

Figure 17:
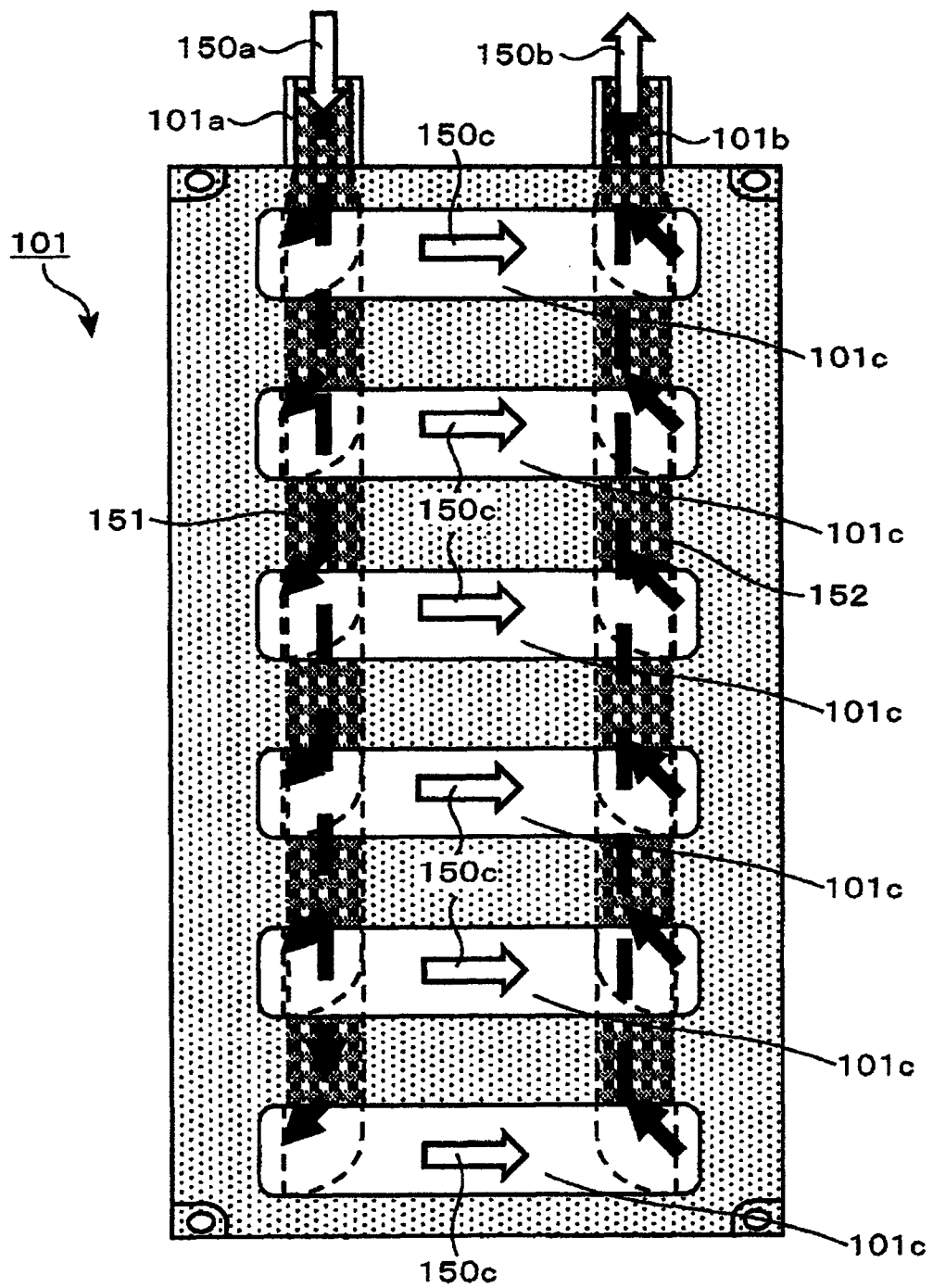
FIG. 17 is a plan view schematically showing a cooling jacket, on which six semiconductor modules are mounted, according to a seventh embodiment of the invention, and showing an example of an advancing direction of a refrigerant, which branches into six streams and merges from six streams.

FIG. 17 is a plan view schematically showing a cooling jacket, on which six semiconductor modules are mounted, and an example of an advancing direction of a refrigerant, which branches into six streams and merges from six streams.

The refrigerant flows into a cooling jacket 101 from an inlet pipe 101a in an advancing direction 150a of the refrigerant in the inlet pipe to flow in a lower layer of a semiconductor power module connected to the inlet pipe in an advancing direction 151 of that refrigerant in a flow passage, which flows in the lower layer of the semiconductor power module, to branch into all (six) the modules, to flow upward from under toward a jacket opening 101c, into which a heatsink 4 of a semiconductor power module 100 is inserted, to advance in an advancing direction 150c of the refrigerant in the heatsink to flow in a lower layer of a semiconductor power module connected to an outlet pipe in an advancing direction 152 of that refrigerant in a flow passage, which flows in the lower layer of the semiconductor power module, to merge from six flow passages, and flows out from the cooling jacket 101 through the outlet pipe 101b in an advancing direction 150b of the refrigerant in the outlet pipe. The present embodiment has a feature in that the number of modules is the same as the number of flow passages, which branching and merging occur, and is preferable since it is possible to prevent influences of liquid temperature rise from being scattered every module, in particular, in the case where modules is large in number. Further, the flow passages 106 for connection between the openings of the cooling jacket can be connected together without a change in an advancing direction of the refrigerant to decrease sites, at which the heatsinks 4 of the semiconductor power modules 100 are inserted, in flow velocity, so that it is possible to achieve a decrease in pressure drop.

In addition, while the fourth embodiment to the seventh embodiment have been described on the assumption that semiconductor power modules 100 are six in number, it is possible to design flow passages in the same manner as above provided that semiconductor power modules 100 are six or more in number.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor power module comprising:
   a DC terminal to be connected to a condenser module, and to be used in combination with a cooling jacket for cooling, wherein the DC terminal protrudes toward the condenser module beyond the cooling jacket, a heatsink, which is in contact with a refrigerant in the cooling jacket to release heat generated from a plurality of power semiconductor elements, an AC terminal, wherein the DC terminal and the AC terminal protrude from a semiconductor power module body, and the heatsink is arranged on that side of the semiconductor power module body, on which the semiconductor power module is combined with the cooling jacket, wherein the DC terminal is provided on one side of an outer periphery of the semiconductor module, and the AC terminal is provided on an opposite side to the DC terminal, laminated flat plates provided between the DC terminal and the AC terminal, and a low-voltage electrode provided on a separate side from the sides on which the DC terminal and the AC terminal are provided, wherein a conducting plate having a curvature is provided in a position, at which the DC terminal and the laminated flat plates are in contact with each other.

2. An inverter module or a converter module comprising the semiconductor power module and the cooling jacket according to claim 1.

3. The semiconductor power module according to claim 1, wherein a gap is present between the heatsink and the cooling jacket.

4. A semiconductor power module comprising:

a DC terminal to be connected to a condenser module, and to be used in combination with a cooling jacket for cooling, wherein the DC terminal protrudes toward the condenser module beyond the cooling jacket, a heatsink, which is in contact with a refrigerant in the cooling jacket to release heat generated from a plurality of power semiconductor elements, and an AC terminal, wherein the DC terminal and the AC terminal protrude from a semiconductor power module body, and the heatsink is arranged on that side of the semiconductor power module body, on which the semiconductor power module is combined with the cooling jacket, wherein a gap is present between the heatsink and the cooling jacket, and wherein fins are provided on a side of the heatsink toward the cooling jacket, and the gap is between tip ends of the fins and the cooling jacket and is at least 0.1 mm but at most 2.0 mm.

5. A semiconductor power module comprising:

a DC terminal to be connected to a condenser module, and to be used in combination with a cooling jacket for cooling, wherein the DC terminal protrudes toward the condenser module beyond the cooling jacket, a heatsink, which is in contact with a refrigerant in the cooling jacket to release heat generated from a plurality of power semiconductor elements, and an AC terminal, wherein the DC terminal and the AC terminal protrude from a semiconductor power module body, and the heatsink is arranged on that side of the semiconductor power module body, on which the semiconductor power module is combined with the cooling jacket, wherein a gap is present between the heatsink and the cooling jacket, and wherein a gap between a base surface of the heatsink and the cooling jacket is at least 0.5 mm.

6. The semiconductor power module according to claim 3, wherein a flow velocity increasing member is provided between the heatsink and the cooling jacket.

7. An inverter/converter comprising:

a semiconductor power module having a DC terminal to be connected to a condenser module, and to be used in combination with a cooling jacket for cooling, wherein the DC terminal protrudes toward the condenser module beyond the cooling jacket and the condenser module is connected to the semiconductor power module by the DC terminal, and wherein the heatsink comprises a base formed with fins, a housing wall of the inverter/converter is provided with the cooling jacket, the semiconductor power module comprises an insulated substrate on which a plurality of power semiconductor elements are mounted, the insulated substrate and the heatsink being bonded to an opposite surface to a surface of the base of the heatsink formed with the fins, the fins are mounted to the housing wall in a manner to be immerged in an opening of the cooling jacket, and the condenser module and the semiconductor power module are arranged on substantially the same plane, the condenser module being arranged adjacent to the semiconductor power module.

8. The inverter/converter according to claim 7, wherein the cooling jacket comprises an inlet pipe and an outlet pipe, and that portion of the cooling jacket, on which the inlet pipe and the outlet pipe are not present, is equal to or less than the semiconductor power module in foot-print size.

9. The inverter/converter according to claim 8, wherein the inlet pipe and the outlet pipe are provided on one side surface of the cooling jacket, a plurality of openings are provided at those sites, at which a plurality of semiconductor power modules are mounted, and the semiconductor power modules are mounted on the respective ones of the plurality of openings, and further comprising a flow passage, through which a refrigerant is supplied to the respective semiconductor power modules from the inlet pipe, and a flow passage, through which the refrigerant is discharged to the outlet pipe from the respective semiconductor power modules.

10. The inverter/converter according to claim 9, wherein the flow passage, through which the refrigerant is supplied to the respective semiconductor power modules from the inlet pipe, and the flow passage, through which the refrigerant is discharged to the outlet pipe from the respective semiconductor power modules, are positioned in a layer below the openings, on which the respective semiconductor power modules are mounted.

11. The inverter/converter according to claim 10, wherein a plurality of flow passages, through which the refrigerant is supplied to the respective semiconductor power modules from the inlet pipe, and a plurality of flow passages, through which the refrigerant is discharged to the outlet pipe from the respective semiconductor power modules, branch/merge in the layer below the openings, on which the respective semiconductor power modules are mounted.

12. The inverter/converter according to claim 11, wherein the flow passages are formed toward that surface, on which the inlet pipe and the outlet pipe are provided, from a semiconductor power module positioned in a location most distant from that surface, on which the inlet pipe or the outlet pipe is provided, in a manner to connect all the openings, on which the plurality of semiconductor power modules are mounted.

13. The inverter/converter according to claim 7, wherein a flow passage for connection between the openings of the cooling jacket is provided just below the DC terminal and the AC terminal.

14. The inverter/converter according to claim 7, wherein the cooling jacket and the heatsink are subjected to surface preparation.

* * * * *